United States Patent
Lin et al.

(10) Patent No.: US 8,254,596 B2
(45) Date of Patent: Aug. 28, 2012

(54) METHOD AND APPARATUS FOR MUTE CONTROL

(75) Inventors: Gaile Lin, Shenzhen (CN); Hong Guan, Shenzhen (CN); Huitao Li, SiChuan (CN)

(73) Assignee: CSR Technology Inc., San Jose, CA (US)

( * ) Notice: Subject to any disclaimer, the term of this patent is extended or adjusted under 35 U.S.C. 154(b) by 0 days.

(21) Appl. No.: 12/299,248

(22) PCT Filed: Jun. 12, 2008

(86) PCT No.: PCT/CN2008/001136
§ 371 (c)(1),
(2), (4) Date: Oct. 31, 2008

(87) PCT Pub. No.: WO2009/149582
PCT Pub. Date: Dec. 17, 2009

(65) Prior Publication Data
US 2011/0075862 A1 Mar. 31, 2011

(51) Int. Cl.
*H03G 3/00* (2006.01)
*H04B 3/00* (2006.01)
*H04B 15/00* (2006.01)
*H02B 1/00* (2006.01)

(52) U.S. Cl. .......... 381/107; 381/81; 381/94.5; 381/123

(58) Field of Classification Search .................. 381/123, 381/81, 85, 102–109, 94.5
See application file for complete search history.

(56) References Cited

U.S. PATENT DOCUMENTS

| | | | | | |
|---|---|---|---|---|---|
| 4,107,464 | A | * | 8/1978 | Lynch et al. | 381/80 |
| 4,207,432 | A | * | 6/1980 | Amazawa et al. | 381/13 |
| 4,887,298 | A | * | 12/1989 | Haigler | 381/55 |
| 5,526,434 | A | * | 6/1996 | Wakui | 381/94.5 |
| 5,577,128 | A | * | 11/1996 | Farinelli, Jr. | 381/81 |
| 5,666,430 | A | * | 9/1997 | Rzeszewski | 381/107 |
| 5,995,633 | A | * | 11/1999 | Cappels et al. | 381/123 |
| 6,154,548 | A | * | 11/2000 | Bizzan | 381/94.5 |
| 6,157,726 | A | * | 12/2000 | Carroll et al. | 381/94.5 |
| 6,195,438 | B1 | * | 2/2001 | Yumoto et al. | 381/103 |
| 2002/0031235 | A1 | * | 3/2002 | Abe | 381/94.5 |
| 2005/0195986 | A1 | * | 9/2005 | McCarty et al. | 381/79 |

FOREIGN PATENT DOCUMENTS

| | | |
|---|---|---|
| CN | 1499632 A | 5/2004 |
| CN | 200953602 Y | 9/2007 |
| CN | 201039105 Y | 3/2008 |
| JP | 2008067187 A | 3/2008 |

OTHER PUBLICATIONS

Written Opinion of the International Searching Authority, PCT/CN2008/001136, dated Mar. 26, 2009.

* cited by examiner

*Primary Examiner* — Kiesha Bryant
*Assistant Examiner* — Dmitriy Yemelyanov
(74) *Attorney, Agent, or Firm* — RatnerPrestia

(57) ABSTRACT

System and method for muting an output terminal of an electronic device. In one embodiment, the process for can include receiving one or more signals received by the controller over the first terminal, detecting a mute control signal from the controller and controlling the state of a switch coupled to the output terminal to ground the output terminal based on detecting the mute control signal.

30 Claims, 3 Drawing Sheets

METHOD AND APPARATUS FOR MUTE CONTROL

CROSS REFERENCE TO RELATED APPLICATION

This application claims priority to International Application No. PCT/CN2008/001136 filed Jun. 12, 2008.

FIELD OF THE INVENTION

The present invention relates in general to muting output of an output terminal and more particularly to a circuit for muting audio output applied to an output terminal.

BACKGROUND

Electronic devices, such as media players, DVD players, and audio systems, etc., have enjoyed commercial success in recent times with developers offering new features such as up conversion of video data, burning video discs, reading multiple disks formats and minimizing device packages. In the electronics industry, developers have been utilizing multimedia chipsets having a reduced number of pins to reduce the overall device size and minimize productions costs. However, while reduced pin count chipsets allow for more compact devices, lower pin counts may effect the features that may be provided. As a result, allocating pins for new multimedia applications can be challenging in addition to including pins for necessary functions.

Chipsets typically employed a 208, or 256, pin configuration. Developers have recently switched to 128 pin configurations. In digital video disc (DVD) standalone players, for example, pins may be employed for necessary functions such as providing a power supply, ground, servo, video, audio, SDRAM, flash memory, USB, Card reader, etc. In some instances, the conventional 128 pin chipset may not contain the necessary pins for desired features, such as a High-Definition Multimedia Interface (HDMI).

Prior art solutions for pin allocation typically employ a plurality of pins for each desired feature. FIG. 1 depicts a simplified block diagram of a conventional approach for muting audio output of a multimedia chipset. As shown in FIG. 1, prior art system 100 requires a first pin 110 to output audio and a second pin 115 to output a mute signal to a control unit 120 configured to apply output to terminal 125. While the prior art system 100 provides a mute feature, the system requires a dedicated output pin, pin 115, to provide a mute signal. The prior art system of FIG. 1 presents an inability to reduce the number of pins for a multimedia chipset.

One conventional approach may be to include an external pin extender to increase pin resources of a chip. However, such an approach can result in an increase in board size and cost. Accordingly there is a need for a way to support desired functions with a reduced pin configuration.

BRIEF SUMMARY OF THE INVENTION

Disclosed and claimed herein are a system and method for muting output of a first terminal of a controller. In one embodiment, the process includes receiving one or more signals received by the controller over the first terminal, detecting a mute control signal from the controller and controlling the state of a switch coupled to the output terminal to ground the output terminal based, at least in part, on detecting the mute control signal.

Other aspects, features, and techniques of the invention will be apparent to one skilled in the relevant art in view of the following detailed description of the invention.

DETAILED DESCRIPTION OF EXEMPLARY EMBODIMENTS

Figure 1:
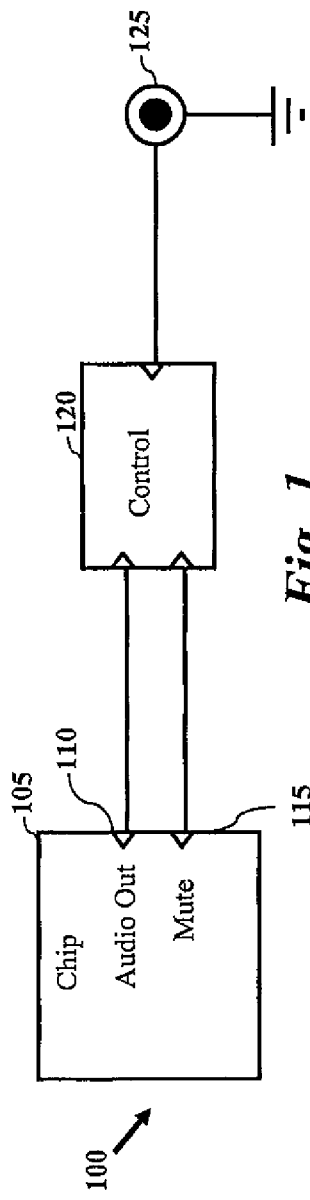
FIG. 1 depicts a typical mute control system.

One aspect of the present invention is directed to reducing the number of output pins required to perform functions of an electronic device by a controller. In one embodiment, the invention relates to a circuit which may be coupled to a controller such that a single pin of the controller may be used to provide one or more output signals to control output of a terminal coupled to the pin. The controller may be coupled to a control circuit configured to ground an output terminal of the device such that the output terminal is muted. In certain embodiments, the controller relates to a multimedia chipset which may be employed by an electronic device such as a compact disc player, video disc player, media player in general, etc. In a further embodiment, a mute control circuit is provided which may be configured to control audio output of a terminal of an electronic device by a connection to a single pin of the controller. To that end, a mute control circuit may be provided for an electronic device to provide output to, and/or mute, an output terminal based on a connection to a single pin of the electronic device controller.

Another aspect of the invention relates to a system for controlling output for an electronic device. In one embodiment, the system may include a control circuit coupled to a single pin of a controller and an output terminal. The output terminal may be connected to one or more devices for and provide one or more control signals for operation. The control circuit may be configured to ground the output terminal based on one or more control signals received from the pin of the controller. In that fashion, the controller may be configured to provide one or more control signals to operate a device using a single pin of the controller. For example, the control circuit may be provided to control output of an electronic device such as a media player. According to another embodiment, a control circuit may be applied to open and/or close a barrier, window, curtain, etc.

According to another embodiment of the invention, a process may be provided for controlling output of a controller using a single pin. In one embodiment, the process may include setting a pin of a controller to output one or more signals for actuation and/or termination of an output terminal. In certain embodiments, the process may include applying one or more signals having differing frequency characteristics to control an output terminal coupled to the controller.

When implemented in software, the elements of the invention are essentially the code segments to perform the necessary tasks. The program or code segments can be stored in a processor readable medium. The "processor readable medium" may include any medium that can store or transfer information. Examples of the processor readable medium include an electronic circuit, a semiconductor memory device, a ROM, a flash memory or other non-volatile memory, a floppy diskette, a CD-ROM, an optical disk, a hard disk, a fiber optic medium, etc. The code segments may be downloaded via computer networks such as the Internet, Intranet, etc.

While FIGS. 2-5 are described in relation to media players it should be appreciated that the principles of the invention are equally applicable to other applications and should not be limited to the preferred embodiments.

Figure 2:
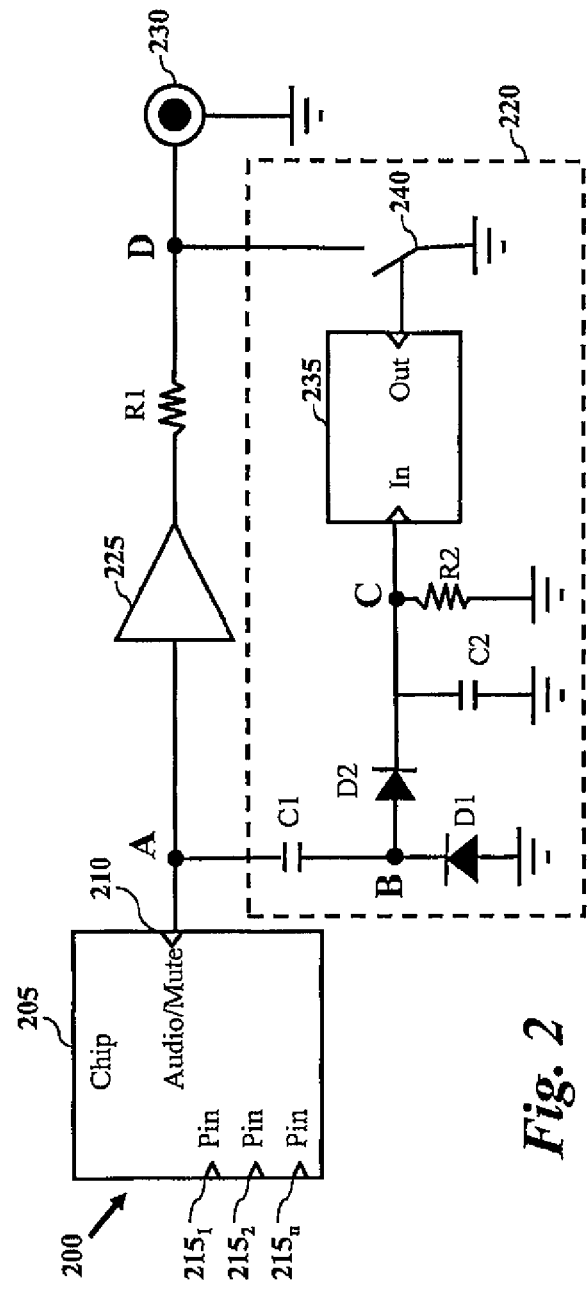
FIG. 2 depicts a mute control system according to one or more embodiments of the invention.

Referring now to FIG. 2, a simplified system diagram is shown of a system according to one or more embodiments. As shown, system 200 includes controller 205 configured to provide one or more output signals using pin 210. In one embodiment, controller 205 may be used to control an electronic device such as a compact disc player, video disc player, media player in general, etc. As such, controller 205 may include logic for processing at least one of audio, video and data in general. Further, controller 205 may be configured to provide one or more of audio, video and control signals using terminal 210. According to one embodiment, controller 205 can be any type of processor such as a microprocessor, field programmable gate array (FPGA), microcontroller unit (MCU) and/or application specific integrated circuit (ASIC). It may also be appreciated that pin 210 may relate to a general purpose input output (GPIO) pin usable to output and/or receive one or more signals in relation to controller 205.

In one embodiment, controller 205 may relate to a 128 pin configuration. As shown in FIG. 2, controller 205 includes a plurality of pins 210 and $215_{1-n}$, wherein each of pin $215_{1-n}$ may be used to output and/or receive one or more signals. Pins $215_{1-n}$ may also be allocated for necessary functions of controller 205 including receiving power, providing a connection to ground, receiving input data, etc. As shown in FIG. 2, pin 210 of controller 205 is coupled to mute control circuit 220. Based on one or more signals output by controller 205 on pin 210, mute control circuit 220 can control output provided by output terminal 230. In that fashion, pin resources of controller 205 may be extended without the use of a pin extender. Using a single pin of controller 205 to provide a mute control and audio output can allow for a smaller board size, smaller package size and/or use of lower pin configurations.

Continuing to refer to FIG. 2, controller 205 may be configured to output one or more audio signals to output terminal 230 using terminal 210. Filter 225 may be configured to pass signals below a predefined frequency. For example, controller 205 may be configured to provide audio signals with the frequency range of 20 Hz to 20 KHz. It may also be appreciated that filter 225 may be configured to receive signals characterized by other frequency ranges or values. For example, in certain embodiments filter 225 may be configured to provide data associated with video data characteristics. Audio signals generated by controller 205 may also be received by mute control circuit 220 and may be detected by switch control module 235. Switch control module 235 may be configured to arrange switch 240 in an open state when an audio signal is received by mute control circuit 220. According to an other embodiment, switch control module 235 and switch 240 may relate to a single switch element such as a transistor switch, solid state switch, circuit switch in general, etc. Exemplary values are shown in Table 1 for system 200 when an audio signal is received according to one or more embodiments. When an audio signal is output on pin 210, the audio signal may be output by output terminal 230 and detected by switch control module 235 to arrange switch 240 in an open state.

According to another embodiment, controller 205 may be configured to output a mute control signal using terminal 210. In one embodiment, the mute control signal may relate to a high frequency clock waveform having a predetermined frequency. For example, a mute control signal generated by controller 205 may relate to a 12 MHZ clock waveform. Frequency characteristics of the mute control signal may be distinct from audio signals received from controller 205 as will be described below in more detail. It should also be appreciated that other values may be used for the mute control signal. Filter 225 maybe be configured to attenuate signals above a predetermined frequency range such that a received mute control single may be attenuated. According to another embodiment, the mute control signal may be detected by switch control module 235. As such, switch 240 may be closed by switch control module 235 to ground output terminal 230. In that fashion, output terminal 230 may be muted.

According to another embodiment, controller 205 may be configured to provide an audio signal and mute in a serial manner. Alternatively it may be appreciated that controller 205 may be configured to provide a mute control signal in addition to an audio signal. As such, switch control module 235 may be configured to detect a mute control signal embedded with an audio signal.

Exemplary values are shown in Table 1 for nodes and terminals of control circuit 220 according to one or more embodiments.

TABLE 1

| | Controller 205 Mute Control Circuit 220 | | | | |
|---|---|---|---|---|---|
| Terminal 210 Output | Desired Audio Status | Point A Frequency | Point C Voltage | Switch 240 Status | Terminal 230 Output/ Point D |
| Audio PWM Output | Un-Mute (Normal) | 384 KHz | 0.2 V | 0.36 | Audio |
| High Frequency Clock Output | Muted | 12 MHz | 1.4 V | 0.7 | Mute, Silence |

Figure 3A:
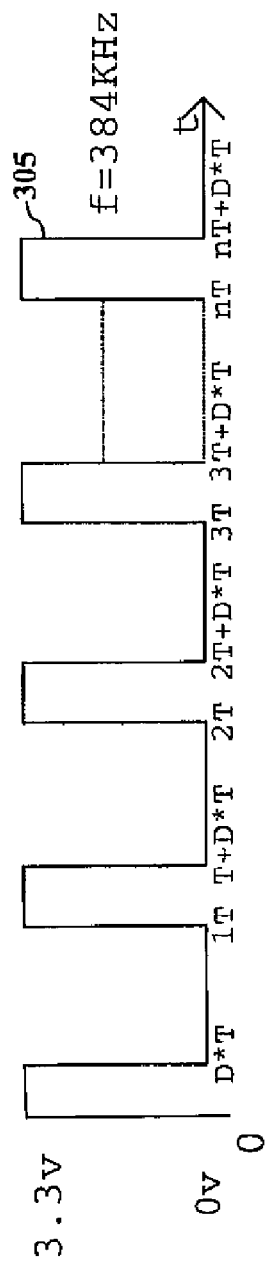
FIGS. 3A-3B depict controller output signals according to one or more embodiments of the invention.
Figure 3B:
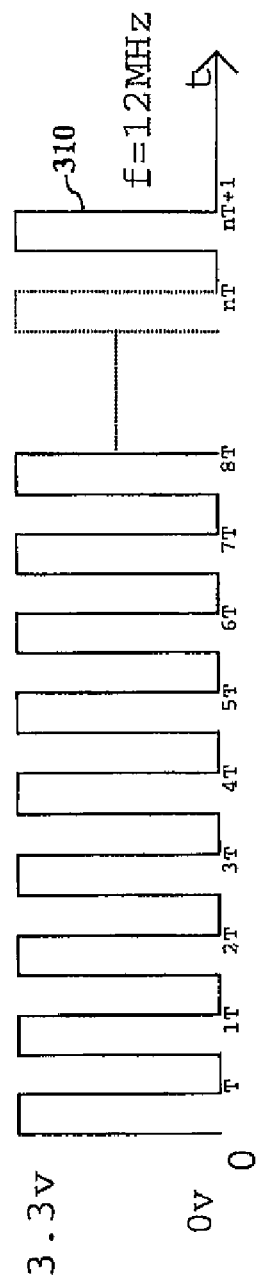

Referring now to FIGS. 3A-3B, exemplary signals are shown which may be generated by the controller of FIG. 2 according to one or more embodiments of the invention. Referring first to FIG. 3A, an audio waveform is shown according to one or more embodiments on the invention. Audio waveform 305 may relate to a pulse width modulated (PWM) waveform according to one embodiment. In one embodiment, audio waveform 305 may be characterized as having an exemplary frequency of 384 KHz. However, it should be appreciated that audio waveform 305 may be characterized in other forms and may be characterized by other frequency values. In one embodiment, a mute control circuit (e.g., mute control circuit 220) may be configured to open and/or maintain a switch (e.g., switch 240) in an open position based on a receiving audio waveform 305. It may also be appreciated that audio waveform 305 conform to one or more audio standards.

Referring now to FIG. 3B, a mute control signal waveform is shown according to one or more embodiments on the invention. Mute control signal waveform 310 is shown as a pulse waveform according to one embodiment characterized by a frequency of 12 MHz. However, it should be appreciated that mute control signal waveform 310 may be characterized in other forms and/or by other frequency values. In one embodiment, a mute control circuit (e.g., mute control circuit 220) may be configured to close and/or maintain a switch (e.g., switch 240) in an closed position based on receiving mute control signal waveform 310. To that end, mute control signal waveform 310 may be provided by outputting a plurality of high frequency pulses to activate a control switch.

Figure 4:
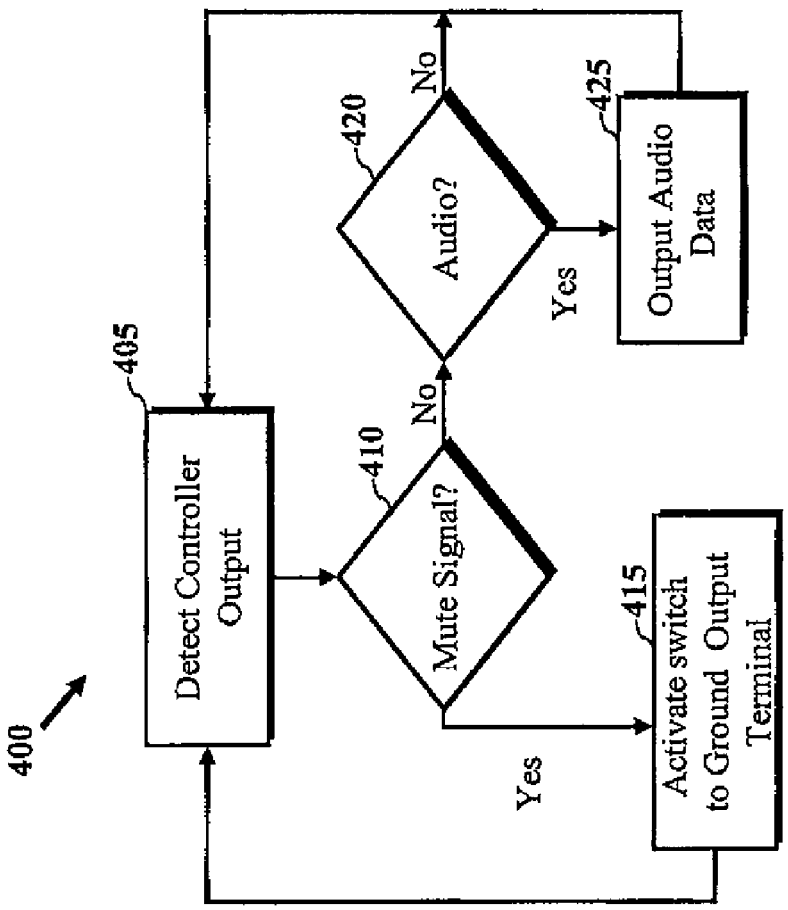
FIG. 4 depicts a flow diagram of a process according to one or more embodiments of the mute control system of FIG. 2.

Referring now to FIG. 4, a flow diagram is shown of a process which may be employed by the system of FIG. 2 according to one or more embodiments of the invention. As shown in FIG. 4, process 400 may be utilized to control output of one or more output signals on an output terminal (e.g., output terminal 230) of a controller (e.g., controller 205). Process 400 may be initiated by detecting one or more controller output signals output by the controller at block 405, wherein the output signals relate to one of an audio signal and a mute control signal. In one embodiment, a mute control circuit (e.g., mute control circuit 220) can determine whether a mute control signal is received at block 410. When a mute control signal is detected ("Yes" path out of decision block 410) the switch control module (e.g., switch control module 235) can close a switch (e.g., switch 240) grounding the output terminal at block 415. Alternatively, when a mute control signal is not detected by the mute control circuit, the switch control module can open and/or maintain the switch in an open position. Further, process 400 may continue with determining if an audio signal is received at decision block 420. When an audio signal is received, ("Yes" path out of decision block 420) audio data may be output to the output terminal at block 425. When a detected controller output signal does not relate to audio data ("No" path out of decision block 420) process 400 may return to detect controller output at block 405.

Figure 5:
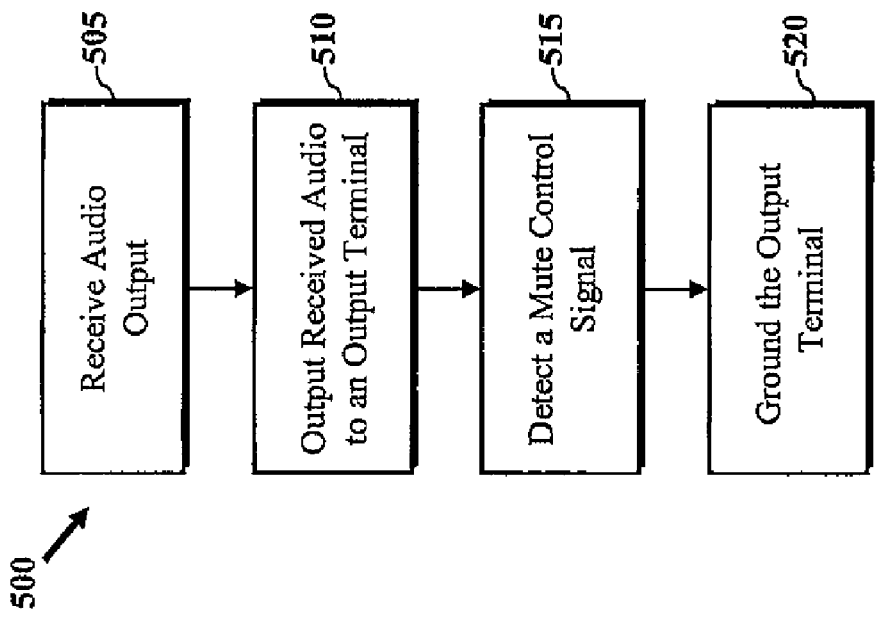
FIG. 5 depicts a process according to one or more embodiments of the invention.

As shown in FIG. 5, process 500 is shown for muting an output terminal (e.g., output terminal 230) of an electronic device using a single terminal (e.g., terminal 210) of a controller (e.g., controller 205) according to one embodiment of the invention. Process 500 may be initiated by receiving audio data at block 505. Audio data received at block 505 may be output using the output terminal of the electronic device at block 510. According to one embodiment, a command may be received by the controller to mute audio output. In certain embodiments, commands may be received by the controller from a user of the electronic device. A mute control signal generated by the controller may be detected by a mute control circuit (e.g., mute control circuit 220) at block 515. Based on the received command, a switch control module (e.g., switch control module 235) may be configured to close a switch (e.g., switch 240) grounding the output terminal at block 520. In that fashion, a mute function may be performed using a single terminal of the controller.

While the processes of FIG. 4 and FIG. 5 have been described related to an audio mute control system, it may be appreciated that one or more of the teachings may be applied to other applications such as opening and/or closing a barrier, window, curtain, etc.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Trademarks and copyrights referred to herein are the property of their respective owners.

What is claimed is:

1. A mute control circuit configured to mute an output terminal of an electronic device, the mute control circuit comprising:

a first terminal coupled to a controller, the first terminal configured to receive a media signal, including an audio or video signal, and a mute control signal from the controller, wherein the media signal occupies a predetermined frequency band and the mute control signal has a frequency above the predetermined frequency band;

a switch coupled to the output terminal, wherein the output terminal is configured to receive the media and mute control signals from the controller and to output the media signal from the controller based, at least in part, on the state of the switch; and a switch control module electrically coupled to the first terminal and the switch, wherein the switch control module is configured to control the state of the switch based, at least in part, on the mute control signal received from the first terminal.

2. The mute control circuit of claim 1, wherein the first terminal is configured to receive at least one of an audio signal and the mute control signal.

3. The mute control circuit of claim 1, wherein the switch control module comprises a circuit element configured to control the switch based on one or more detected signals.

4. The mute control circuit of claim 1, wherein the switch control module is configured to ground the output terminal by closing the switch based, at least in part, on detecting the mute control signal.

5. The mute control circuit of claim 1, wherein the switch control module is configured to hold the switch in an open state to allow the output terminal to output one or more audio signals.

6. The mute control circuit of claim 1, wherein the controller and the output terminal are electrically coupled to each other through a filter.

7. A method for muting output of an output terminal of a controller, the method comprising:

receiving one or more signals from the controller, by a first terminal coupled to the controller, wherein the output terminal is configured to receive and output the one or more signals from the controller and wherein the one or more signals include a media signal occupying a predetermined frequency band and a mute control signal having a frequency above the predetermined frequency band;

detecting the mute control signal on the first terminal; and controlling the state of a switch coupled to the output terminal to ground the output terminal based, at least in part, on the detecting.

8. The method of claim 7, wherein the one or more signals received from the controller relate to at least one of an audio signal and the mute control signal.

9. The method of claim 7, further comprising detecting an audio signal from the controller and outputting the received audio signal to the output terminal.

10. The method of claim 7, further comprising controlling the switch to be in an open state to allow the output terminal to output one or more audio signals.

11. The method of claim 7, further comprising filtering the one or more signals received by the output terminal.

12. A system comprising:

a controller configured to output one or more signals, wherein an output terminal is configured to receive and output the one or more signals from the controller wherein the one or more signals include a media signal occupying a predetermined frequency band and a mute control signal having a frequency above the predetermined frequency band; and a mute control circuit having a first terminal coupled to the controller, a switch coupled to the output terminal, and a switch control module electrically coupled to the first terminal and the switch, wherein the mute control circuit is configured to:
receive the one or more signals from the controller over the first terminal;
detect the mute control signal from the controller; and
control the switch using the switch control module, wherein the switch control module is configured to control the state of the switch to ground the output terminal based, at least in part, on the detecting.

13. The system of claim 12, wherein the first terminal is configured to receive at least one of an audio signal and the mute control signal.

14. The system of claim 12, wherein the switch control module comprises a circuit element configured to control the switch based on one or more signals detected by the switch control module.

15. The system of claim 12, wherein the switch control module is configured to ground the output terminal by closing the switch based at least in part on detecting.

16. The system of claim 12, wherein the switch control module is configured to hold the switch in an open state to allow the output terminal to output one or more audio signals.

17. The system of claim 12, wherein the system further comprises a filter coupled to the input terminal between the controller and the output terminal.

18. The system of claim 12, wherein the detecting comprises detecting a waveform of the mute control signal.

19. The system of claim 12, wherein the detecting comprises detecting the mute control signal embedded with at least one of the one or more signals from the controller.

20. The mute control circuit of claim 1, wherein the switch control module controls the state of the switch based on detecting a waveform of the mute control signal from the controller.

21. The mute control circuit of claim 1, wherein the switch control module controls the state of the switch based on detecting the mute control signal embedded with at least one of the one or more signals from the controller.

22. The method of claim 7, wherein the detecting comprises detecting the mute control signal embedded with at least one of the one or more signals from the controller.

23. A system comprising:
a controller configured to output one or more signals, wherein an output terminal is configured to receive and output the one or more signals from the controller and wherein the one or more signals include a control signal having a predetermined frequency and at least one other signal occupying a predetermined frequency band below the predetermined frequency; and
a control circuit having a first terminal coupled to the controller, a switch coupled to the output terminal, and a switch control module electrically coupled to the first terminal and the switch, wherein the control circuit is configured to:
receive the one or more signals from the controller via the first terminal; and
control the switch using the switch control module, wherein the switch control module is configured to control the state of the switch based, at least in part, on detecting the control signal from the controller.

24. The system of claim 23, wherein each of the one or more signals from the controller comprises a signal selected from the group consisting of an audio signal, a video signal and the control signal.

25. The system of claim 23, wherein the detecting comprises detecting a waveform of the control signal.

26. The system of claim 23, wherein the detecting comprises detecting the control signal embedded with the at least one of the one or more signals from the controller.

27. The system of claim 23, wherein the control circuit selectively (a) opens, (b) closes, or (c) opens and closes an apparatus.

28. The system of claim 23, wherein the switch control module is configured to ground the output terminal by closing the switch.

29. The system of claim 23, wherein the switch control module is configured to hold the switch in an open state and allow, at least in part, the output terminal to output the one or more signals from the controller.

30. The system of claim 23, wherein the system further comprises a filter coupled between the controller and the output terminal.

\* \* \* \* \*

UNITED STATES PATENT AND TRADEMARK OFFICE
CERTIFICATE OF CORRECTION

| | | |
|---|---|---|
| PATENT NO. | : 8,254,596 B2 | Page 1 of 1 |
| APPLICATION NO. | : 12/299248 | |
| DATED | : August 28, 2012 | |
| INVENTOR(S) | : Gaile Lin, Hong Guan and Huitao Li | |

It is certified that error appears in the above-identified patent and that said Letters Patent is hereby corrected as shown below:

Title page, Item 57, should read as follows:

--Provided is a system and method for muting an output terminal of an electronic device. In one embodiment, the method includes receiving one or more signals received by a controller over a first terminal, detecting a mute control signal from the controller, and controlling a state of a switch coupled to the output terminal to ground the output terminal based on detecting the mute control signal--.

Signed and Sealed this
Twelfth Day of March, 2013

Teresa Stanek Rea
*Acting Director of the United States Patent and Trademark Office*